United States Patent [19]

Georlette et al.

[11] Patent Number: 4,481,158
[45] Date of Patent: Nov. 6, 1984

[54] EXTRUSION OF FILMS OF VINYLIDENE FLUORIDE POLYMERS

[75] Inventors: Pierre Georlette, Il - Oner Alyad, Israel; Nestor Maquet, Waha, Belgium

[73] Assignee: Solvay & Cie (Société Anonyme), Brussels, Belgium

[21] Appl. No.: 442,122

[22] Filed: Nov. 16, 1982

[30] Foreign Application Priority Data

Nov. 16, 1981 [FR] France ................................. 81 21538

[51] Int. Cl.³ .............................................. B29D 7/24
[52] U.S. Cl. ...................................... 264/22; 264/127; 264/178 R; 264/210.1; 264/210.2; 264/289.6
[58] Field of Search ....................... 264/22, 127, 210.1, 264/289.6, 210.2, 178 R

[56] References Cited

U.S. PATENT DOCUMENTS

| | | |
|---|---|---|
| 2,728,951 | 1/1956 | O'Hanlon et al. |
| 3,087,198 | 4/1963 | Edwards |
| 3,402,428 | 9/1968 | Schreiber |
| 3,676,539 | 7/1972 | Fisher ............................ 264/210.1 |
| 3,691,264 | 9/1972 | Asahina ................................. 264/22 |
| 3,878,274 | 4/1975 | Murayama et al. .................... 264/22 |
| 4,066,729 | 1/1978 | Van Cappellen ................. 264/210.1 |
| 4,241,128 | 12/1980 | Wang ..................................... 264/22 |
| 4,302,408 | 11/1981 | Ichihara et al. ....................... 264/22 |
| 4,345,359 | 8/1982 | Micheson .............................. 264/22 |
| 4,390,674 | 6/1983 | Ward et al. ........................... 264/22 |

FOREIGN PATENT DOCUMENTS

| | | |
|---|---|---|
| 2146856 | 3/1973 | France . |
| WO81/01567 | 6/1981 | PCT Int'l Appl. . |
| 1173688 | 12/1969 | United Kingdom . |
| 1339295 | 11/1973 | United Kingdom . |

OTHER PUBLICATIONS

"Electric-Field-Induced Phase Charger in Poly (Vinylidine Fluoride)", Davis et al., J. Appl. Phys. 49 (10) Oct. 78, pp. 4998-5002.

*Primary Examiner*—James Lowe
*Attorney, Agent, or Firm*—Spencer & Frank

[57] ABSTRACT

The film (11) extruded from a vinylidene fluoride polymer is subjected to a stretching of at least 200% while still in the molten state, and then cooled rapidly to a temperature below 50° C.

The equipment comprises, in series, an extruding device (1) (2), a cooling device consisting of a thermostatically controlled liquid bath (6), the level of which is located at a distance of 10 to 300 mm from the extruding device, and a device (8) (9) for stretching the extruded film by at least 200% in its part located between the extruding device and the cooling device.

The film obtained is suitable for manufacturing piezoelectric films.

11 Claims, 1 Drawing Figure

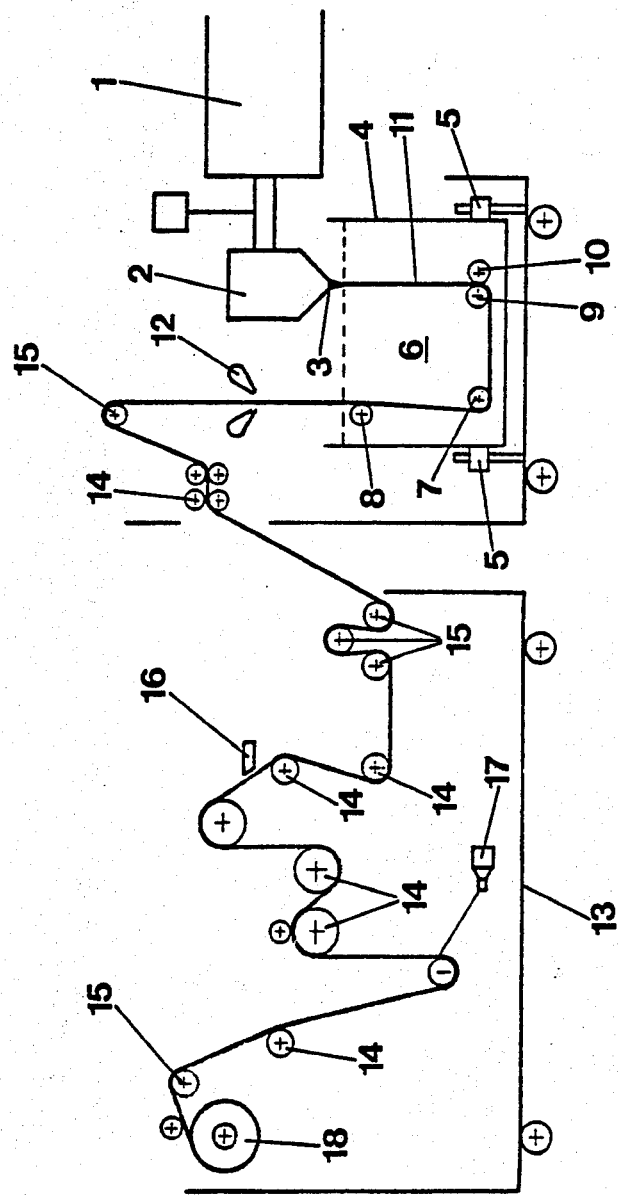

EXTRUSION OF FILMS OF VINYLIDENE FLUORIDE POLYMERS

BACKGROUND OF THE INVENTION

The present invention relates to a process for the extrusion of films of vinylidene fluoride polymers, to a process for the manufacture of piezoelectric films from films obtained by the abovementioned process, and also to equipment for carrying out the abovementioned process.

It is known at the present time to produce films of vinylidene fluoride polymers which possess noteworthy piezoelectric properties and which are particularly suitable for the electronics industry.

Thus, British Pat. No. 1,339,295 (KUREHA KAGAKU KOGYO K.K.) describes a technique leading to polyvinylidene fluoride films possessing good piezoelectric properties, which consists in subjecting a film of this polymer, consisting preponderantly of crystals of the beta type, to a direct polarising voltage of between 200 and 1,500 KV/cm. According to the said document, it is not possible to produce the starting film directly by extrusion and cooling, because this technique always leads to films essentially containing crystals of the alpha type, which are therefore unsuitable. To obtain a suitable starting film, it is necessary, according to the said document, to subject a cooled extruded film to an additional monoaxial or biaxial stretching operation at a temperature below 130° C., and preferably below 50° C., so as to convert the crystals of the alpha type to crystals of the beta type. This stretching treatment must be carried out carefully and at a low speed in order to ensure the desired crystallographic conversion. In order to simplify the manufacturing process, it generally suffices to subject the film of alpha crystallinity to longitudinal stretching. However, it seems that this monoaxial stretching carried out at low temperature leads to a deterioration in the transverse mechanical properties of the film, and the latter may even tend to fibrillate. Moreover, the film has an inadequate tear strength after nicking. The films thus obtained therefore have unsatisfactory mechanical properties.

SUMMARY OF THE INVENTION

The object of the present invention is to provide a process which permits the direct production, by extrusion and cooling, of films of vinylidene fluoride polymers which predominantly have a crystalline structure of the beta type, which are therefore suitable for the manufacture of piezoelectric films and which do not have the shortcomings of the films obtained by the known processes.

The invention therefore relates to a process for the extrusion of films of vinylidene fluoride polymers, in which an extruded film of molten polymer is subjected to a stretching of at least 200% in the direction of extrusion, and the stretched film is cooled rapidly to a temperature below 50° C.

DETAILED DESCRIPTION OF THE INVENTION

The term "vinylidene fluoride polymers" is understood as meaning any polymers containing at least 50 mol%, and preferably at least 85 mol%, of monomeric units derived from vinylidene fluoride. The vinylidene fluoride polymers which are suitable for carrying out the process according to the invention therefore include not only vinylidene fluoride homopolymers but also its copolymers containing monomeric units derived from one or more comonomers. Particularly advantageous results are obtained with vinylidene fluoride polymers containing at least 85 mol%, and preferably 100 mol%, of monomeric units derived from vinylidene fluoride, any remainder preferably consisting of monomeric units derived from other fluorinated olefines, such as vinyl fluoride, trifluoroethylene, chlorotrifluoroethylene, tetrafluoroethylene and hexafluoropropylene.

In the process according to the invention, the extruded film, which can be in the form of a plane film or tubular sleeve, is subjected to stretching in the direction of extrusion whilst the polymer is still in the molten state.

The extrusion of the film and the consecutive stretching of the molten film are carried out at a temperature between the melting point and the thermal degradation temperature of the constituent polymer. The optimum extrusion temperature of course depends on the rheological characteristics of the polymer. It is generally between the melting point of the polymer and about 325° C. The film is therefore stretched at a temperature which is at least equal to the melting point of its constituent polymer, the latter consequently being in the amorphous state during stretching. The stretching ratio is at least 200% and preferably at least 500%, but it can reach and even exceed values of 5,000%. As this stretching is carried out on the amorphous molten polymer, it has no effect on the mechanical properties either in the direction of extrusion or in the transverse direction of the film produced. As the stretching to which the extruded film is subjected leads to a significant reduction in its thickness, it is advantageous, in order to prevent disadvantageous cooling of the film during stretching, to carry out the latter at high speed. Thus, it is preferred to carry out this stretching at a film speed, after stretching, which is equal to at least 10 m/minute and preferably equal to at least 50 m/minute.

After it has been stretched in the molten state, the film is cooled rapidly to a temperature below 50° C., preferably below 35° C. and more particularly below 20° C. Any means can be used for cooling the film, for example: the blasting of cold air or the vaporisation of a liquid. However, it is important to ensure rapid cooling of the film.

According to one embodiment of the invention, the film stretched in the molten state is cooled by placing the stretched extruded film in direct contact with a cooled roller. In this case, it is desirable for the roller to be kept at a temperature below 20° C., preferably below 15° C. and more particularly below 10° C.

According to a particularly effective embodiment of the invention, which is consequently preferred, the film stretched in the molten state is cooled by immersion in a thermostatically controlled liquid bath at a temperature below 50° C. and preferably below 25° C., it being possible for the liquid to be water or alternatively a mixture of water and ethylene glycol.

In the process according to the invention, it is preferable for the film to be cooled as rapidly as possible after it has been stretched, and the cooling zone is therefore advantageously located near the extrusion die. Thus, it has proved particularly advantageous to cool the stretched film when it has travelled a distance of at most 300 mm, and preferably of at most 100 mm, after leaving the die. In general, for practical reasons, the distance travelled is more than 10 mm.

After cooling, the film can be wound, if appropriate after drying. The film can also be subjected to a subsequent reheating treatment, which is generally carried out at temperatures of between 75° C. and the melting point of its constituent polymer. Moreover, the film can be coated with metal by the usual processes, and this can be done on one or both of its faces.

In order to impart piezoelectric or pyroelectric properties to the film obtained by the process described above, it is subjected to a polarising treatment, which can be carried out by any process which is in itself known, for example by the corona effect or by applying a constant or variable electric field, the film being at a temperature below the melting point of the polymer.

To carry out the process according to the invention, equipment is used which comprises, in series, an extruding device equipped with a vertical die for the production of a film, a stretching device, and a cooling device located at a distance of less than 300 mm from the die. This equipment can be followed by a winding device and, if appropriate, by a reheating device.

According to a particularly preferred embodiment, the cooling device consists of a liquid bath and the stretching device consists of two adjacent pressure rollers immersed in the liquid bath and caused to rotate in opposite directions, for example by a variable-speed motor. In general, the bath is thermostatically controlled.

Equipment of this type is illustrated diagrammatically in the single FIGURE of the attached drawing.

As shown in this FIGURE, the equipment comprises an extruder 1 equipped with a conventional vertical flat die 2 whose lips are separated by a distance which can vary between 0.3 and 1 millimeter. The equipment also comprises a tank 4 mounted on adjusting jacks 5, this tank being located in line with the die, thermostatically controlled and filled with a cooling liquid 6, for example water. The adjusting jacks are adapted so that the distance separating the end of the die 2 from the level of the cooling bath 6 can vary between 20 and 300 mm. Moreover, the tank comprises return and guide rollers 7,8 and pressure rollers 9, 10, which are immersed and driven by a variable-speed motor, not shown, which is adapted so that a tractive force can be exerted on the extruded film 11. A device 12 for drying the film is provided at the outlet of the tank 4. The equipment also comprises a winder 13 equipped with return rollers 14, with crease-removing rollers 15, with a system 16, 17 for cutting off and removing the edges, and with a winding roller 18.

The speeds of the rollers 14, 15 and 18 are adjusted so that the portion of film located between the outlet of the tank 4 and the winder 18 is taut but not subjected to a substantial tractive force.

According to another embodiment, not illustrated, the cooling and stretching device consists of at least one cooling roller which is kept at a temperature below 20° C. and preferably below 15° C. The first roller is arranged so that the initial contact between the extruded film and this roller is located at a distance of less than 300 mm from the die. The cooling roller or rollers are preferably metal rollers coated, if appropriate, with a thin non-stick film. Moreover, the speed of rotation of the rollers is adjusted so that the extruded film is stretched by at least 200% in the direction of extrusion, between the die and the first cooling roller.

Examples 1 to 5, an account of which follows, were carried out with equipment according to the first particular embodiment described above, in which the extruder was a Troester UP60 extruder equipped with a 400 mm wide Reifenhauser flat die and the winder was a Spannkraft winder.

EXAMPLE 1

Vinylidene fluoride homopolymer of trademark Solef and of type 1008, produced and marketed by Solvay & Cie, is introduced into the extruder 1.

The various extrusion parameters are adjusted so as to produce, at the die, a 0.5 mm thick film at a temperature of 250° C. Using the jacks 5, the height of a thermostatically controlled liquid bath, consisting of water at 30° C., is adjusted so that the level of the bath is located at a distance of 20 mm from the end of the die 2. The extruded film is introduced between the pressure rollers 9, 10, the separation and speed of which are adjusted so that they exert a tractive force on the film and draw it along at a speed of 11 m/minute, so as to stretch the film in its portion location between the die and the level of the bath and to reduce its thickness to 0.04 mm. Finally, the extruded film is fed onto the winder 18.

When the installation is operating under normal conditions, samples of film are taken from the winder 18, their mechanical strength properties in the longitudinal direction and in the transverse direction are determined and the absorption ratio $D_{530}/D_{510}$ is determined by infra-red absorption spectrography. It is considered that a polyvinylidene fluoride film possesses a sufficient proportion of crystals of the beta type and is particularly suitable for piezoelectric applications if the ratio $D_{530}/D_{510}$ is less than 1.2 and preferably less than 1 (British Pat. No. 1,339,295 mentioned above). The values recorded are shown in Table I below.

EXAMPLE 2

The procedure is exactly as in Example 1, except for the following modifications:
initial thickness of the extruded film: 0.35 mm
distance between the die and the level of the bath: 70 mm
temperature of the bath: 20° C.
speed of traction: 23 m/minute.

This gives a 0.02 mm thick film; samples of this are taken and subjected to the same determinations as in Example 1. The results recorded are shown in Table I below.

EXAMPLE 3

The procedure is exactly as in Example 2, except that the speed of traction is increased to 30 m/minute.

This gives a 0.015 mm thick film; samples of this are taken and subjected to the same determinations as in Example 1. The results recorded are shown in Table I below.

EXAMPLE 4

The procedure is exactly as in Example 2, except that the speed of traction is increased to 35 m/minute.

This gives a 0.01 mm thick film; samples of this are taken and subjected to the same determinations as in Example 1. The results recorded are shown in Table I below.

TABLE I

| Example | Thickness mm | Transverse tensile strength, MPa | Longitudinal tensile strength, MPa | $D_{530}/D_{510}$ |
|---|---|---|---|---|
| 1 | 0.040 | 43 | 49 | 0.90 |
| 2 | 0.020 | 45 | 52 | 0.68 |
| 3 | 0.015 | 35 | 39 | 0.57 |
| 4 | 0.010 | 37 | 38 | 0.27 |

The results recorded show that the films obtained are perfectly suitable for manufacturing piezoelectric films. These films do not show a significant deterioration in their mechanical strength in the transverse direction. Moreover, they have an excellent tear strength after nicking.

EXAMPLE 5

In the equipment described above, a round die having a diameter of 8 mm is used, which is equipped with a core having a diameter of 5 mm.

The thermostatically controlled bath is kept at 18° C. and its level is kept at a distance of 120 mm from the end of the extrusion die.

Vinylidene fluoride homopolymer of trademark Solef and of type 1010, produced and marketed by Solvay & Cie, is introduced into the extruder and the extrusion parameters are adjusted so as to extrude a tube at a temperature of 215° C. This tube is introduced between the pressure rollers, the separation and speed of which are adjusted so that they exert a tractive force on the tube and draw it along at a speed of 20 m/minute.

When the installation is operating under normal conditions, a tubular sleeve having a wall thickness of 0.3 mm is obtained, which is perfectly suitable for the sleeving of optical fibres.

EXAMPLE 6

Vinylidene fluoride homopolymer of trademark Solef and of type 1008, produced and marketed by Solvay & Cie, is introduced into an extruder equipped with a flat die, and the extrusion parameters are adjusted so as to produce, at the die, a 0.5 mm thick film at 250° C.

At a distance of 70 mm from the die, the extruded film is pressed against a cooling roller, which is kept at a temperature of 7.5° C. by the circulation of a cooling fluid. The speed of rotation of the cooling roller is adjusted so that the extruded film is stretched in the molten state and in the direction of extrusion to an extent such that its thickness is reduced to 0.040 mm. The cooled stretched film is then fed onto a winder via a series of crease-removing rollers, and this is done without exerting a substantial traction on this film.

When the installation is operating under normal conditions, samples of the film produced are taken from the winder and the absorption ratio $D_{530}/D_{510}$ is determined thereon by infra-red absorption spectrography. It is found that the samples have a ratio $D_{530}/D_{510}$ of 0.69, which implies that they preponderantly have a crystalline structure of the beta type and are perfectly suitable for manufacturing piezoelectric films.

The tensile strength of these samples, both in the transverse direction and in the longitudinal direction, is determined and it is found that these strengths are respectively 45 and 50 MPa. These last results show, on the one hand, that the film obtained has similar mechanical properties in both directions, and, on the other hand, that the film has not been subjected to substantial stretching after cooling.

EXAMPLE 7 (comparison)

The procedure is as in Example 6, except that the cooling roller is kept at 30° C., which does not permit sufficiently rapid cooling of the film stretched in the molten state.

The ratio $D_{530}/D_{510}$, measured on samples of the resulting film taken from the winder, is 9, which indicates that the preponderant crystalline structure of the film thus obtained is of the alpha type and that this film is therefore hardly suitable for manufacturing piezoelectric films.

A sample of film taken from the winder is then subjected to a stretching of 500% in the direction of extrusion, according to the prior art, the primary effect of which is to reduce its thickness to 0.010 mm.

The ratio $D_{530}/D_{510}$, measured on the resulting film, is 0.1, which implies that its preponderant crystalline structure is now of the beta type.

The tensile strength of the sample thus obtained, both in the transverse direction and in the longitudinal direction, is also determined and it is found that these strengths are respectively 5 and 370 MPa. It therefore appears that the mechanical strengths are substantially different and that the film obtained is of low strength in the direction perpendicular to the stretching direction.

We claim:

1. Process for the extrusion of films of vinylidene fluoride polymers having a predominantly crystalline structure of the beta type, comprising: subjecting an extruded film of molten polymer to a stretching of at least 200% in the direction of extrusion, and cooling the stretched film to a temperature below 50° C. when it has travelled a distance of at most 300 mm after leaving the die.

2. Process according to claim 1, wherein the film is subjected to a stretching of at least 500%, and is cooled to a temperature below 35° C.

3. Process according to claim 1, wherein the stretched film is cooled when it has travelled a distance of at most 100 mm after leaving the die.

4. Process according to claim 1, wherein the stretching is carried out at a film speed, after stretching, which is equal to at least 50 m/minute.

5. Process for the manufacture of piezoelectric films from films obtained by the process of claim 1, wherein this film is subjected to a polarising treatment.

6. Process according to claim 1, wherein the polymer is a vinylidene fluoride homopolymer.

7. Process according to claim 1, wherein the polymer is a vinylidene fluoride copolymer containing at least 85 mol% of vinylidene fluoride.

8. Process according to claim 2 wherein the stretching is carried out at a film speed, after stretching, which is equal to at least 50 m/minute.

9. Process for the manufacture of piezoelectric films from films produced by the process of claim 2 wherein this film is subjected to a polarising treatment.

10. Process according to claim 2 wherein the vinylidene fluoride polymer is vinylidene fluoride homopolymer.

11. Process according to claim 2 wherein the vinylidene fluoride polymer is a vinylidene fluoride copolymer containing at least 85 mol% of vinylidene fluoride.

* * * * *